US009147460B2

United States Patent
Matsumoto

(10) Patent No.: US 9,147,460 B2
(45) Date of Patent: Sep. 29, 2015

(54) MEMORY CONTROLLER, MEMORY CONTROL METHOD, AND MEMORY CONTROL SYSTEM

(71) Applicant: Renesas Electronics Corporation, Kawasaki-shi, Kanagawa (JP)

(72) Inventor: Takayuki Matsumoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 301 days.

(21) Appl. No.: 13/907,275

(22) Filed: May 31, 2013

(65) Prior Publication Data
US 2013/0332669 A1    Dec. 12, 2013

(30) Foreign Application Priority Data

Jun. 11, 2012  (JP) ................. 2012-132232

(51) Int. Cl.
| G11C 11/401 | (2006.01) |
| G11C 11/403 | (2006.01) |
| G11C 11/406 | (2006.01) |
| G11C 11/4076 | (2006.01) |

(52) U.S. Cl.
CPC ...... *G11C 11/40607* (2013.01); *G11C 11/4076* (2013.01); *G11C 11/40611* (2013.01)

(58) Field of Classification Search
CPC ............. G11C 11/40607; G11C 11/4076
See application file for complete search history.

(56) References Cited

U.S. PATENT DOCUMENTS

| 5,802,555 A * | 9/1998 | Shigeeda ................. 711/106 |
| 2014/0237177 A1* | 8/2014 | Yu et al. ................. 711/106 |
| 2014/0262767 A1* | 9/2014 | Subramani et al. ...... 204/298.13 |

FOREIGN PATENT DOCUMENTS

| JP | 04-060988 A | 2/1992 |
| JP | 06-236683 A | 8/1994 |
| JP | 08-129883 A | 5/1996 |
| JP | 2000-235789 A | 8/2000 |
| JP | 2003-151270 A | 5/2003 |
| JP | 2007-287314 A | 11/2007 |
| JP | 2009-059412 A | 3/2009 |
| JP | 2010-170608 A | 8/2010 |
| JP | 2011-018435 A | 1/2011 |

* cited by examiner

*Primary Examiner* — Evan Pert
(74) *Attorney, Agent, or Firm* — Sughrue Mion, PLLC

(57) ABSTRACT

The memory controller is provided with a refresh clock generation unit, a control signal generation unit, and a refresh request generation unit. The refresh clock generation unit generates a clock obtained by frequency dividing a system clock, as a refresh clock. The control signal generation unit issues a refresh command to a memory, based on the refresh clock. The refresh request generation unit curtails, based on a specified refresh count in a specified refresh period determined by the memory, a supply to the control signal generation unit of a redundant refresh clock generated exceeding the specified refresh count, the refresh clock being generated within the specified refresh period.

12 Claims, 15 Drawing Sheets

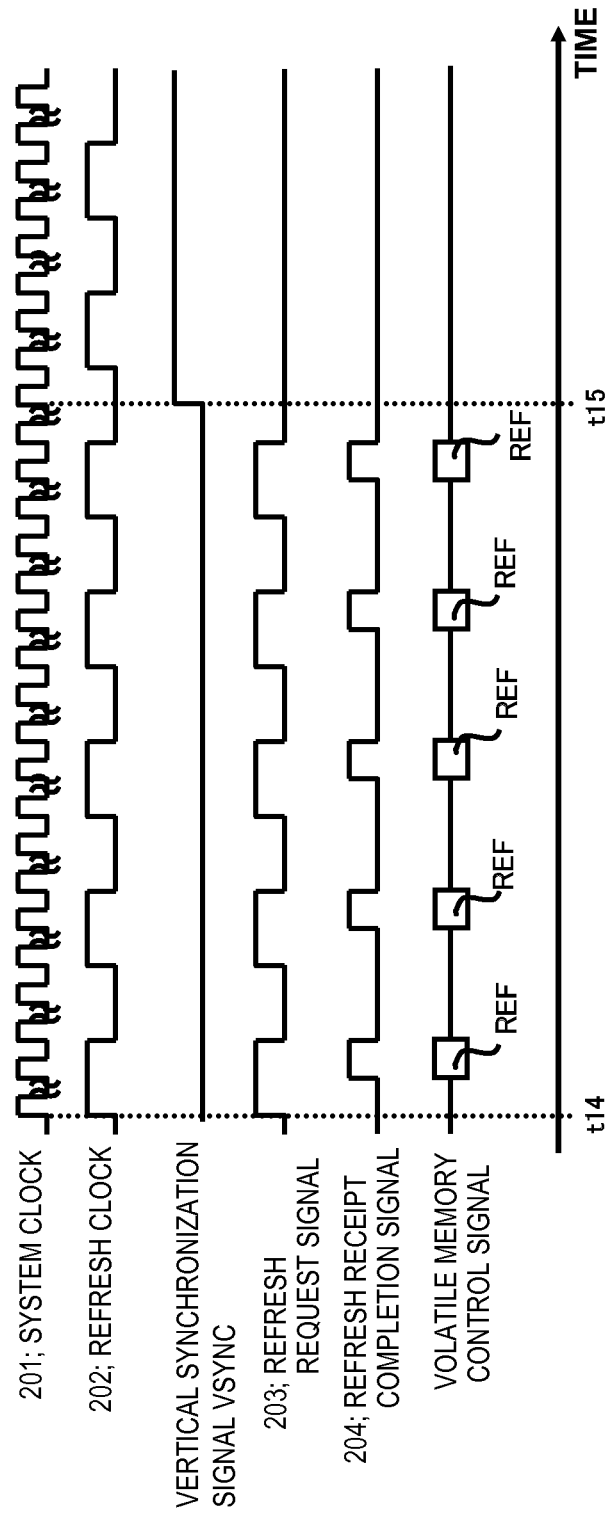

MEMORY CONTROLLER, MEMORY CONTROL METHOD, AND MEMORY CONTROL SYSTEM

REFERENCE TO RELATED APPLICATION

This application is based upon and claims the benefit of the priority of Japanese patent application No. 2012-132232, filed on Jun. 11, 2012, the disclosure of which is incorporated herein in its entirety by reference thereto.

BACKGROUND OF THE INVENTION

1. Field of the Invention

The present invention relates to a memory controller, a memory control method, and a memory control system. The invention may be preferably used, for example, in volatile memory refresh control.

2. Description of Related Art

Volatile memory including DRAM (Dynamic Random Access Memory) has a memory cell structure to hold data, and the memory has to be periodically refreshed. Refresh control of the volatile memory is performed by a memory controller connected to the memory. The volatile memory and the memory controller are embedded in a system requiring a volatile memory, and operate based on a clock generated within the system. In particular, the memory controller performs volatile memory control including refresh control based on a system clock generated within the system or a clock obtained by frequency dividing the system clock.

Meanwhile, a refresh control specification as stipulated for a volatile memory is prescribed as a "requirement to issue a refresh command at least a certain number of times within a certain period". That is, it is sufficient if the memory controller is in compliance with the specification concerning refresh control of the volatile memory, and timing at which a refresh command is issued is left to the memory controller.

In this regard, Patent Literature 1 discloses technology implemented by proceeding with refresh control for a volatile memory when the memory controller is in an idle state. By the memory controller disclosed in Patent Literature 1 being implemented to proceed with refresh control, it is not necessary to give priority to refresh control when the memory controller is in a busy state, and deteriorated performance of the overall system including the volatile memory is prevented.

In addition, Patent Literatures 2 to 7 disclose various types of technology concerning refresh control of volatile memory, and Patent Literatures 8 to 9 disclose technology where refresh control of volatile memory is realized.

[Patent Literature 1]
JP Patent Kokai Publication No. JP2011-018435A
[Patent Literature 2]
JP Patent Kokai Publication No. JP2000-235789A
[Patent Literature 3]
JP Patent Kokai Publication No. JP2003-151270A
[Patent Literature 4]
JP Patent Kokai Publication No. JP2009-059412A
[Patent Literature 5]
JP Patent Kokai Publication No. JP-H04-060988A
[Patent Literature 6]
JP Patent Kokai Publication No. JP-H06-236683A
[Patent Literature 7]
JP Patent Kokai Publication No. JP-H08-129883A
[Patent Literature 8]
JP Patent Kokai Publication No. JP2007-287314A
[Patent Literature 9]
JP Patent Kokai Publication No. JP2010-170608A

SUMMARY

The respective disclosures of the Patent Literatures given above are hereby incorporated in their entirety by reference into this specification. The following analysis made by the inventors of the present invention.

As described above, a memory controller performs refresh control of a volatile memory using a system clock or a clock obtained by frequency dividing the system clock. In this regard, a specification related to refresh control of the volatile memory is decided independently of a system clock cycle. Therefore, as for the refreshment command which a memory controller publishes to volatile memory, it is rare to agree with the number of times of issue of the refresh command which the specification of volatile memory defines.

Therefore, by issuing more refresh commands than the specification determined by the volatile memory (that is, the number of times a refresh command is issued), the memory controller is compliant with the specification determined by the volatile memory.

However, the issuing of such redundant refresh commands is unnecessary from the viewpoint of the volatile memory, and an unnecessary signal (refresh command) is supplied to a bus connecting the volatile memory and the memory controller. When a signal is supplied to the bus, devices other than the memory controller connected to the same bus cannot use the bus. Accordingly, due to the memory controller issuing wasteful refresh commands, usage efficiency of the bus deteriorates.

In recent years in particular, data volumes handled by systems including volatile memory are increasing, and a variety of efforts are being made to improve bus usage efficiency. For example, by expanding modes of a bus used in a system from a single layer to a multilayer bus, an improvement in bus usage efficiency is realized. In this situation, deterioration in bus usage efficiency by the memory controller issuing wasteful refresh commands cannot be allowed. Accordingly, there is a desire for a memory controller, a memory control method, and a memory control system that improves usage efficiency of a bus connected to volatile memory.

Other issues and new features will become clear from the description of the present specification and attached drawings. A description will be given later concerning details of specific refresh control by the memory controller and redundant refresh commands generated therewith.

According to an exemplary embodiment of the disclosure, there is provided a memory controller including a refresh clock generation unit, a control signal generation unit, and a refresh request generation unit. The refresh clock generation unit generates a clock obtained by frequency dividing a system clock, as a refresh clock. The control signal generation unit issues a refresh command to a memory, based on the refresh clock. The refresh request generation unit curtails, based on a specified refresh count in a specified refresh period determined by the memory, a supply to the control signal generation unit of a redundant refresh clock generated exceeding the specified refresh count, the refresh clock being generated within the specified refresh period.

BRIEF DESCRIPTIONS OF THE DRAWINGS

FIG. 6 is a diagram showing an example of an internal configuration of a refresh request generation unit 30a;

FIG. 15 is a diagram showing an example of a timing chart of various types of signal in the memory control system 5.

PREFERRED MODES

Figure 1:
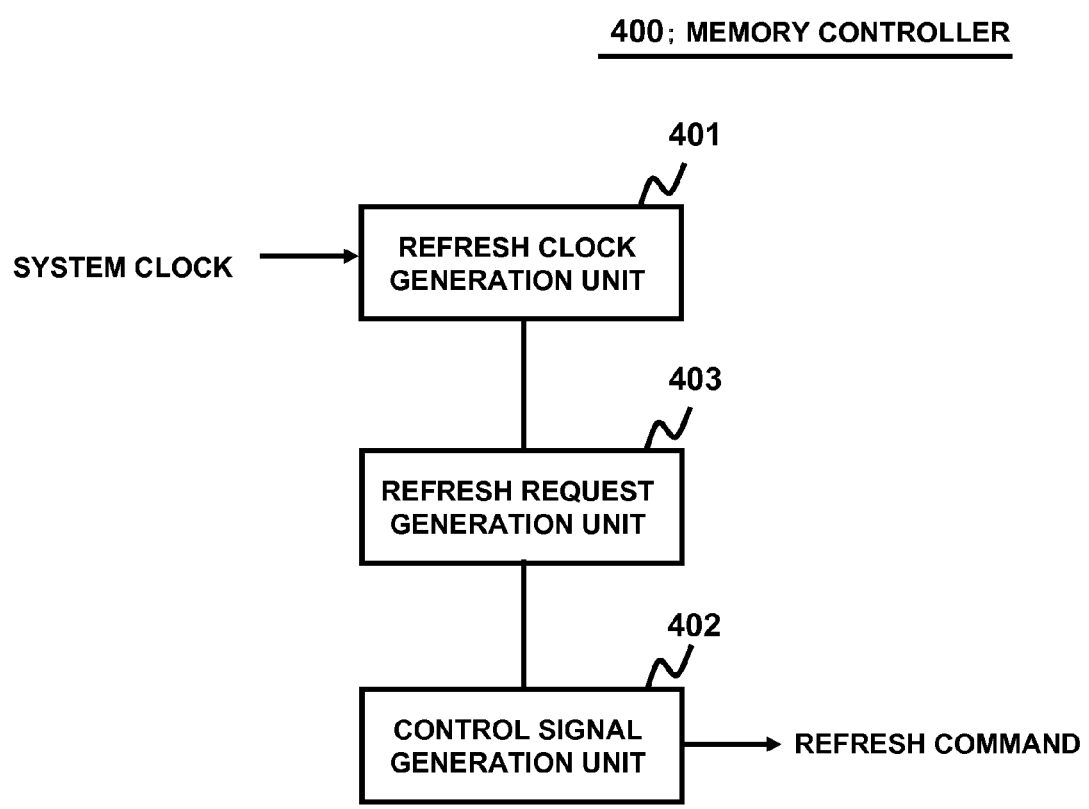
FIG. 1 is a diagram for describing an outline of an exemplary embodiment.

First, a description is given concerning an exemplary embodiment using FIG. 1. It is to be noted that that reference symbols in the drawings attached to this summary are attached for convenience to respective elements as examples in order to aid understanding, and descriptions of the summary are not intended to limit the present disclosure in any way.

As described above, various types of technology have been studied in order to improve bus usage efficiency. In this situation, deterioration in bus usage efficiency by a memory controller issuing wasteful (redundant) refresh commands cannot be allowed. Therefore, it is desired to have a memory controller that improves usage efficiency of a bus connected to a volatile memory.

Thus, a memory controller 400 shown in FIG. 1 as an example is provided. The memory controller 400 is provided with a refresh clock generation unit 401, a control signal generation unit 402, and a refresh request generation unit 403. The refresh clock generation unit 401 generates a clock obtained by frequency dividing a system clock, as a refresh clock. The control signal generation unit 402 issues a refresh command to the volatile memory, based on the refresh clock. The refresh request generation unit 403 curtails, based on a specified refresh count in a specified refresh period determined by the volatile memory, a supply to the control signal generation unit 402 of a redundant refresh clock generated exceeding the specified refresh count, the refresh clock being generated within the specified refresh period.

A system clock cycle received by the refresh clock generation unit 401 can be comprehended from the design stage of a system including the memory controller 400. Furthermore, information related to refreshing the volatile memory (the specified refresh period and the specified refresh count) is also known information. Therefore, the number of redundant refresh clocks generated within the specified refresh period can also be comprehended from these items of information. Thus, the refresh request generation unit 403 curtails the supply of the redundant refresh clock to the control signal generation unit 402. As a result, since redundant refresh commands are not supplied to a bus connecting the memory controller 400 and the volatile memory, it is possible to improve the bus usage efficiency.

Additionally, the following modes are possible.

Mode 1

A memory controller comprises: a refresh clock generation unit that generates a clock obtained by frequency dividing a system clock, as a refresh clock; a control signal generation unit that issues a refresh command to a memory, based on the refresh clock; and a refresh request generation unit that curtails, based on a specified refresh count in a specified refresh period determined by the memory, a supply to the control signal generation unit of a redundant refresh clock generated by exceeding the specified refresh count, with respect to the refresh clock generated within the specified refresh period.

Mode 2

The memory controller preferably comprises: a PWM (Pulse Width Modulation) control register that holds PWM configuration information related to cycle and duty ratio of a PWM waveform; wherein the refresh request generation unit comprises: a PWM circuit that outputs a PWM waveform based on the PWM configuration information, an AND circuit that receives the refresh clock and the PWM waveform, and a refresh adjustment unit that activates a refresh request signal outputted to the control signal generation unit, based on an output signal of the AND circuit; and wherein the control signal generation unit, on issuing the refresh command in accordance with the refresh request signal that is activated, activates a refresh receipt completion signal outputted to the refresh adjustment unit; and the refresh adjustment unit deactivates the refresh request signal in accordance with the activated refresh receipt completion signal.

Mode 3

The AND circuit preferably receives a signal obtained by inverting the PWM waveform, and the refresh adjustment unit preferably activates the refresh request signal in synchronization with rising of the refresh clock outputted by the AND circuit.

Mode 4

The PWM configuration information preferably is information determined based on a cycle of the system clock, the specified refresh period, and the specified refresh count.

Mode 5

The refresh request generation unit preferably curtails supply to the control signal generation unit of the refresh clock generated within the specified refresh period, at a uniform interval, based on the number of the redundant refresh clocks.

Mode 6

The memory controller preferably comprises: a refresh count register that holds refresh count register information determined based on a cycle of the system clock, the specified refresh period, and the specified refresh count; wherein the refresh request generation unit comprises: a refresh counter that counts the refresh clock and outputs a count value as a refresh count value, a comparator that compares the refresh count register information and the refresh count value; an AND circuit that receives the refresh clock and an output signal of the comparator, and a refresh adjustment unit that activates a refresh request signal outputted to the control signal generation unit, based on an output signal of the AND circuit; and wherein the control signal generation unit, on issuing the refresh command in accordance with the refresh request signal that is activated, activates a refresh receipt completion signal outputted to the refresh adjustment unit; and the refresh adjustment unit deactivates the refresh request signal in accordance with the activated refresh receipt completion signal.

Mode 7

The refresh count register is preferably configured to include: a refresh count configuration register that holds the specified refresh count as refresh count configuration information, and a refresh mask register that holds the number of times the redundant refresh clock is issued as refresh mask information; wherein a divider circuit is provided to output a result of dividing the refresh count configuration information by the refresh mask information, as the refresh count register information.

Mode 8

A memory control method comprises: generating a refresh clock by frequency dividing a system clock; issuing a refresh command to a memory based on the refresh clock; and curtailing, based on a specified refresh count in a specified refresh period determined by the memory, a supply of a redundant refresh clock generated exceeding the specified refresh count, the refresh clock being generated within the specified refresh period.

Mode 9

Curtailing the redundant refresh clock preferably comprises: outputting a PWM (Pulse Width Modulation) waveform based on PWM configuration information determined based on a cycle of the system clock, the specified refresh period, and the specified refresh count; and curtailing a supply of the redundant refresh clock, based on the PWM waveform.

Mode 10

Curtailing the redundant refresh clock preferably comprises curtailing a supply of the refresh clock generated within the specified refresh period, at a uniform interval, based on the number of the redundant refresh clocks.

Mode 11

Curtailing the redundant refresh clock comprises: supplying the refresh clocks equivalent in number to the specified refresh count; and curtailing a supply of the refresh clocks equivalent in number to the redundant refresh clocks.

Mode 12

A memory control system comprises: an image chip that outputs a vertical synchronization signal; a memory that stores an image signal; a system clock generation unit that generates a system clock; and a memory controller that comprises: a refresh clock generation unit that generates a clock obtained by frequency dividing a system clock, as a refresh clock; a control signal generation unit that issues a refresh command to the memory, based on the refresh clock; and a refresh request generation unit that curtails a supply to the control signal generation unit of the generated refresh clock during a first logic level where the vertical synchronization signal indicates a period in which the image signal is transmitted.

First, an outline is given concerning refresh control of the memory controller.

It is to be noted that in the following description, a specification concerning refreshing a volatile memory relates to a refresh standard. A period in which at least a certain number of refresh commands are requested to be issued is defined to a specified refresh period, being a specification included in the refresh standard. In addition, the number of refresh commands requested in the specified refresh period is defined to the refresh operation count.

First an outline is given concerning refresh control of a volatile memory disclosed by Patent Literature 1, making reference as appropriate to FIG. 1 of Patent Literature 1.

FIG. 1 of Patent Literature 1 shows a memory control block 100. The memory control block 100 includes: a volatile memory 110, a refresh counter 130, and a control device 120 that controls the volatile memory 110 and the refresh counter 130.

An object of Patent Literature 1 is to reduce performance deterioration of an overall system by proceeding with and concentrating refresh control, when the control device 120 is in an idle state (a period in which the volatile memory 110 is not accessed). That is, by proceeding with execution of refresh control in an idle state, it is no longer necessary to perform refresh control when in a busy state, and performance deterioration of the overall system is reduced.

Specifically, when a determination is made that the control device 120 is in an idle state, auto-refreshing is performed in the volatile memory 110. After the auto-refreshing is performed, the control device 120 confirms the value of the refresh counter 130. In this regard, in a case of a determination that the value of the refresh counter 130 has not reached a maximum value, the control device 120 increments the refresh counter 130. Every time the refresh counter 130 is incremented, the control device 120 performs additional auto-refreshing. As a result, even when it is necessary to periodically execute scheduled refreshing, since refresh control is already performed, it is not necessary to again perform refresh control. That is, regardless of the control device 120 being in a busy state, there is no necessity to interrupt with refresh control.

Thus, the memory control block 100 disclosed by Patent Literature 1 reduces performance deterioration of the overall system by going ahead with, and concentrating, refresh operations when the control device 120 is in an idle state. In this regard, execution of refresh control is managed by using the refresh counter 130. As described above, Patent Literature 1 discloses technology for determining whether or not to execute refresh control in accordance with the state of the control device 120 (idle state or busy state).

However, the technology disclosed by Patent Literature 1 is for an implementation that goes ahead with refresh control which is scheduled in advance, and if scheduling thereof is executed in synchronization with a system clock, it may be said that wasteful refresh control is performed. Accordingly, with the technology disclosed by Patent Literature 1, it is not possible to improve the usage efficiency of a bus connected to the volatile memory. It is to be noted that Patent Literature 1 does not refer to what timing the refresh control of the volatile memory is executed at.

Next, a description is given concerning refresh control by a memory controller using a system clock as investigated by the inventors of the present application.

Figure 2:
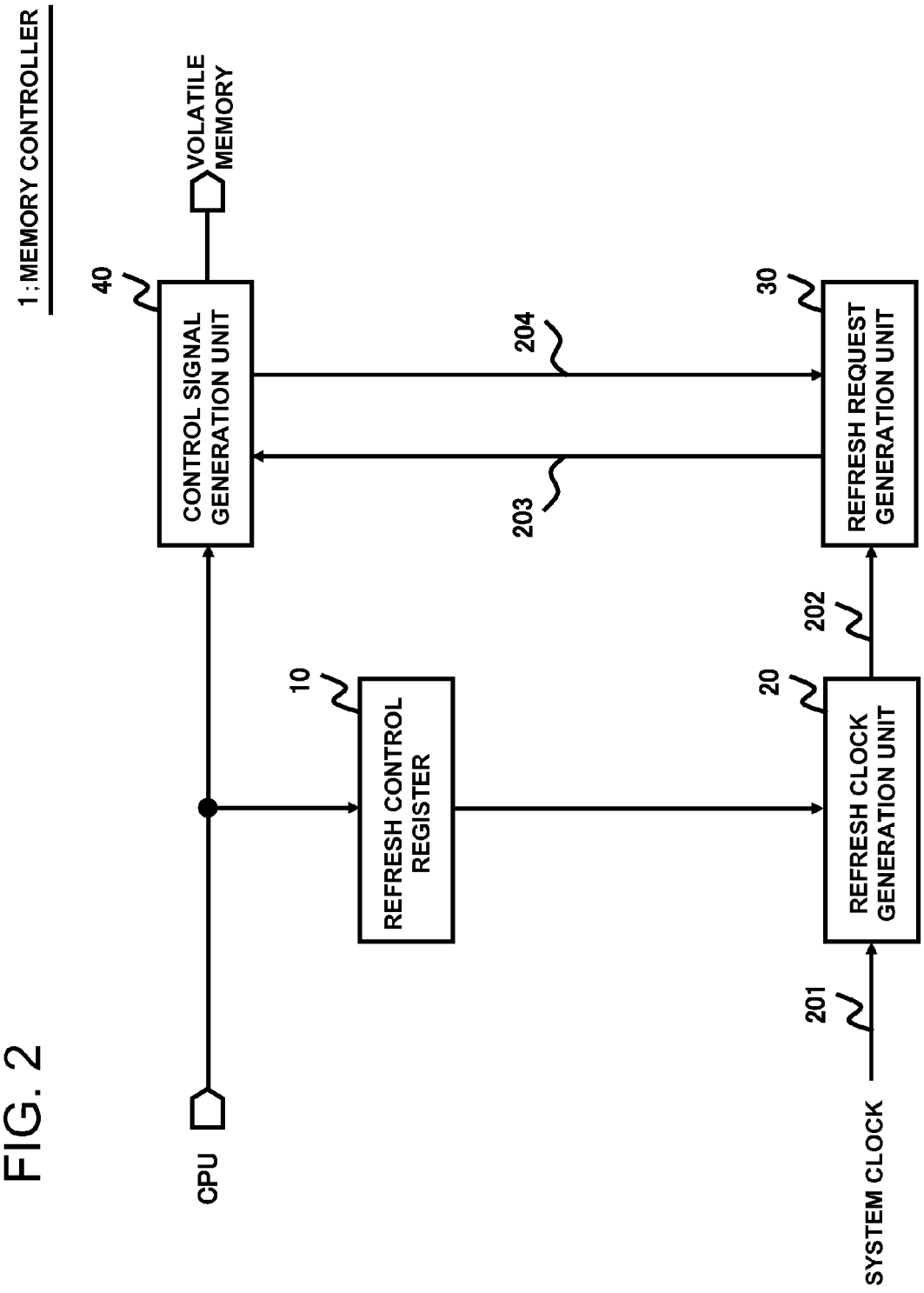
FIG. 2 is a diagram showing an example of an internal configuration of a memory controller 1.

FIG. 2 is a diagram showing an example of an internal configuration of the memory controller 1.

The memory controller 1 is connected to a CPU (Central Processing Unit) and a volatile memory via a bus. In addition, the memory controller 1 receives a system clock 201 generated internally in the system that includes the memory controller.

The memory controller 1 is configured by including a refresh control register 10, a refresh clock generation unit 20, a refresh request generation unit 30, and a control signal generation unit 40.

The refresh control register 10 is a register that holds frequency division ratio information received from the CPU. The frequency division ratio information is information determined based on a cycle of the system clock 201 and the refresh standard. The refresh control register 10 holds information related to the frequency division ratio of the system clock 201, which is necessary for satisfying the refresh standard.

The refresh clock generation unit 20 performs frequency division on the supplied system clock 201, based on the frequency division ratio information held by the refresh control register 10. The refresh clock generation unit 20 outputs the clock obtained by frequency dividing the system clock 201 as a refresh clock 202, to the refresh request generation unit 30.

The refresh request generation unit 30 outputs an activated refresh request signal 203 to the control signal generation unit 40, in synchronization with rising of the refresh clock 202. It is to be noted that, when active, the refresh request signal 203 has a H level.

On receiving the activated refresh request signal 203, the control signal generation unit 40 outputs a refresh command to the volatile memory. At this time, the control signal generation unit 40 outputs an activated refresh receipt completion signal 204 to the refresh request generation unit 30, as a signal indicating that issuing of a refresh command has been completed. On receiving the activated refresh receipt completion signal 204, the refresh request generation unit 30 deactivates the refresh request signal 203. It is to be noted that, when active, the refresh receipt completion signal 204 has a H level.

Figure 3:
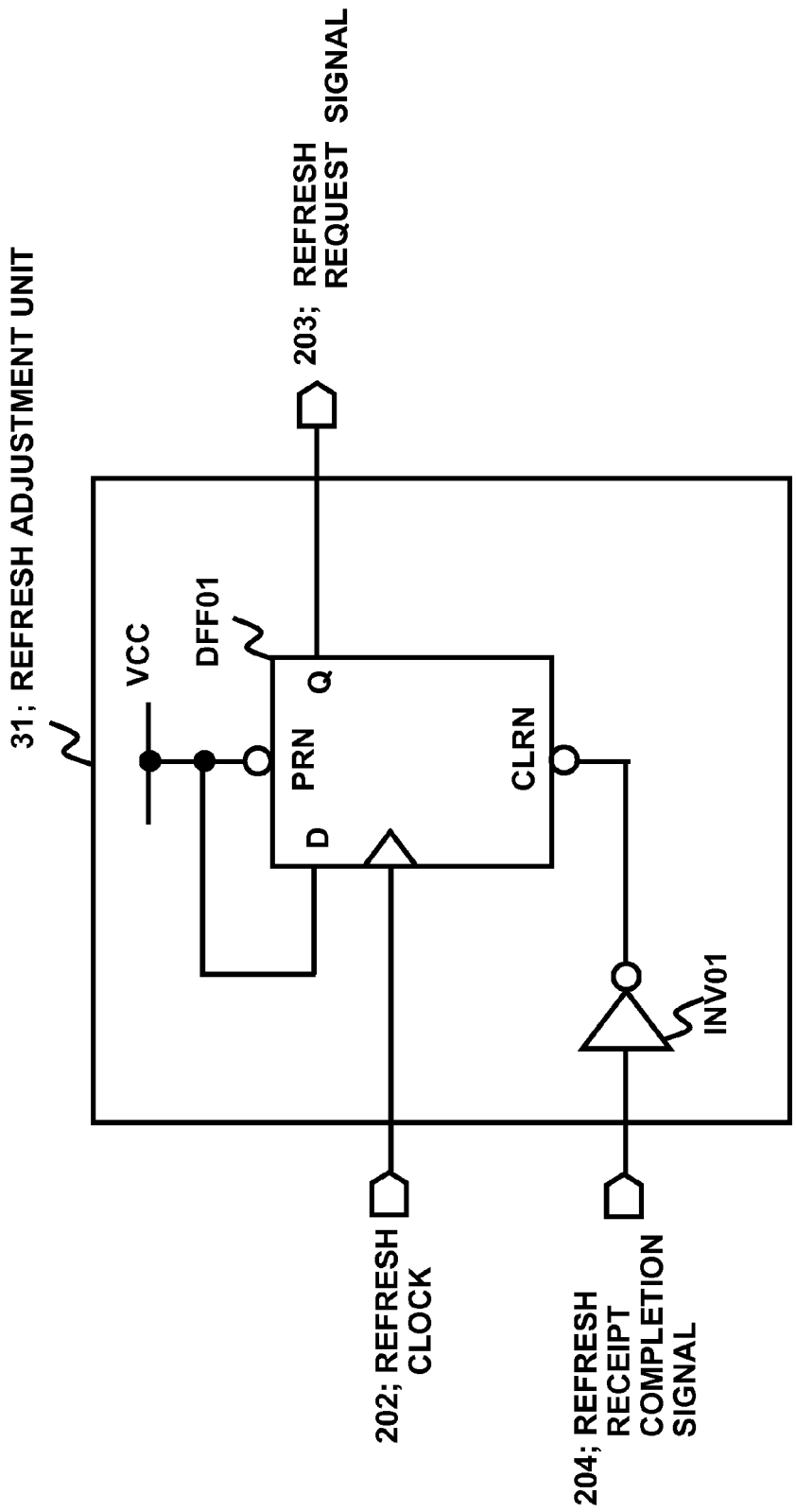
FIG. 3 is a diagram showing an example of an internal configuration of a refresh request generation unit 30.

FIG. 3 is a diagram showing an example of an internal configuration of the refresh request generation unit 30.

The refresh request generation unit 30 is configured to include a refresh adjustment unit 31. On receiving the refresh clock 202, the refresh adjustment unit 31 activates the refresh request signal 203. When the refresh receipt completion signal 204 is received, the refresh request signal 203 is deactivated.

The refresh adjustment unit 31 is composed of a flip-flop DFF01 and an inverter circuit INV01. The flip-flop DFF01 receives the refresh clock 202 at a clock terminal, with a data input terminal and a preset terminal being connected to a power supply voltage VCC (fixed to a H level). A clear terminal of the flip-flop DFF01 receives a signal obtained by the refresh receipt completion signal 204 being inverted by the inverter circuit INV01. A signal outputted from a data output terminal of the flip-flop DFF01 forms the refresh request signal 203.

The refresh adjustment unit 31 outputs the activated refresh request signal 203 to the control generation unit 40 in synchronization with rising of the refresh clock 202.

Next, a description is given concerning operation of the memory controller 1 shown in FIG. 2.

Figure 4:
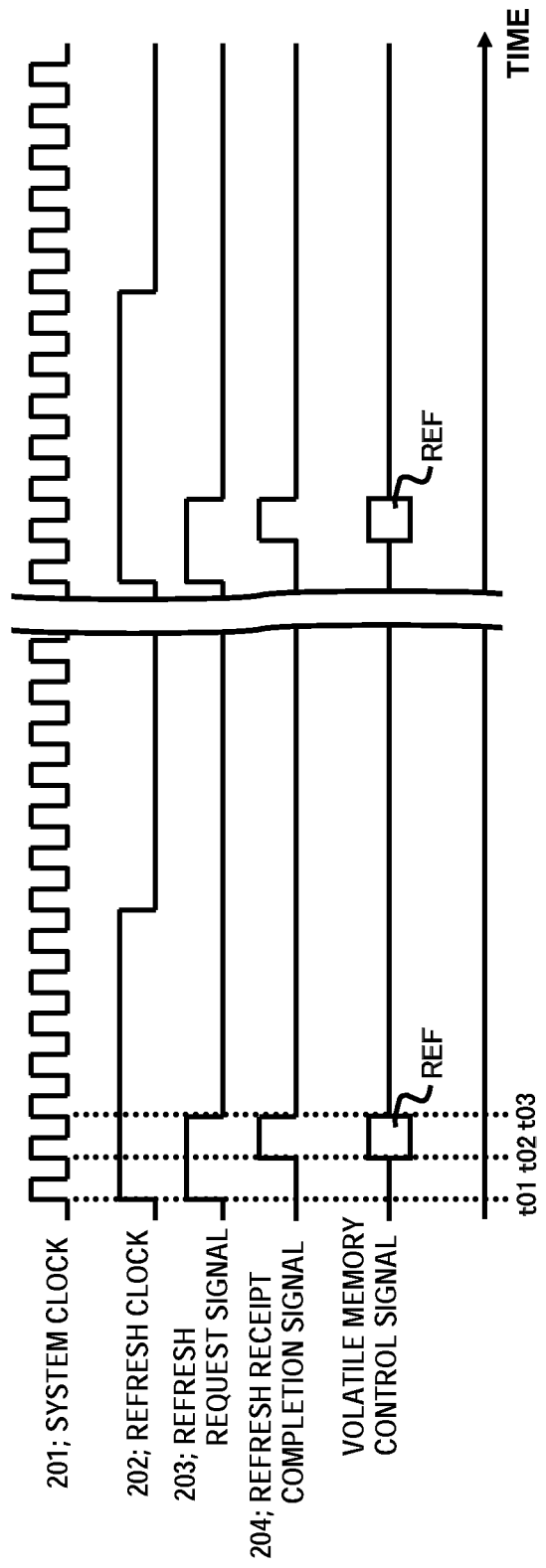
FIG. 4 is a diagram showing an example of a timing chart of a signal related to refresh control of the memory controller 1.

FIG. 4 is a diagram showing an example of a timing chart of a signal related to refresh control of the memory controller 1.

At time t01, the refresh clock 202 outputted by the refresh clock generation unit 20 transitions to a H level. By receiving a rising edge of the refresh clock 202, the refresh request generation unit 30 activates the refresh request signal 203.

The control signal generation unit 40 that receives the activated refresh request signal 203 issues a refresh command (time t02). At this time, the control signal generation unit 40 activates the refresh receipt completion signal 204. It is to be noted that in the diagrams below, a refresh command is described as REF.

The refresh request generation unit 30 that receives the activated refresh receipt completion signal 204 deactivates the refresh request signal 203 (sets to an L level; time t03). By repeatedly issuing the refresh command, the memory controller 1 complies with the refresh standard. However, with the refresh control of the memory controller 1, wasteful refresh commands are issued.

Here, with a cycle of the refresh clock 202 of 15.25 µs, a description is given as to what extent redundant refresh commands are issued. It is to be noted that with a specified refresh period of 64 ms and a specified refresh count of 4096, the frequency division ratio of the system clock 201 (cycle of the refresh clock 202) is selected as appropriate. It should be noted that appropriate selection of the frequency division ratio indicates selecting a frequency division ratio such that the refresh clock 202 obtained from the selected frequency division ratio, among frequency division ratios that can be selected by the refresh clock generation unit 20, satisfies the refresh standard, and the number of refresh clocks 202 within the specified refresh period and the specified refresh count are closest.

During a specified refresh period of 64 ms, the refresh clock 202 rises approximately 4196 times (64 ms/15.25 µs). Therefore, the refresh request signal 203 is activated 4196 times in a period of 64 ms, and the refresh command is also issued 4196 times. However, since the specified refresh count is 4096 times, 100 refresh commands are redundant.

In this way, the memory controller 1, while issuing redundant refresh commands, carries out refresh control of the volatile memory based on the refresh clock 202 obtained by frequency dividing the system clock 201.

It is to be noted that an ideal cycle of the refresh clock 202 in the abovementioned refresh standard is 15.625 µs (64 ms/4096 times). However, there is a restriction on the selection of the frequency division ratio of the system clock 201, and normally it is not possible to generate the refresh clock 202 with an ideal cycle. That is, as long as refresh timing of the volatile memory is decided based on the system clock 201, it is difficult to satisfy the refresh standard demanded by the volatile memory without an excess or a deficiency. However, a problem occurs in that, by performing wasteful refreshing with respect to the specified refresh count, usage efficiency of the bus deteriorates. Furthermore, there is a problem in that execution of wasteful refreshing leads to an increase in power consumption of the overall system.

It is to be noted that it is not possible to use a method of curtailing wasteful refresh operations by independently generating the refresh clock. This because it is not allowed, with respect to cost or to substrate area, to provide a clock generation circuit including a crystal oscillator or the like, only in order to generate a refresh clock having an ideal cycle.

In addition, when information transmitted and received via the bus increases, the bus usage efficiency itself often becomes directly linked to system performance (the bus performance becomes a bottleneck of the system). In recent years in particular, volatile memory capable of high-speed data transmission is increasing, as in DDR-SDRAM (Double-Data-Rate Synchronous Dynamic Random Access Memory), and it is desired to further improve bus usage efficiency.

First Exemplary Embodiment

A detailed description is given concerning a first exemplary embodiment, making use of the drawings.

Figure 5:
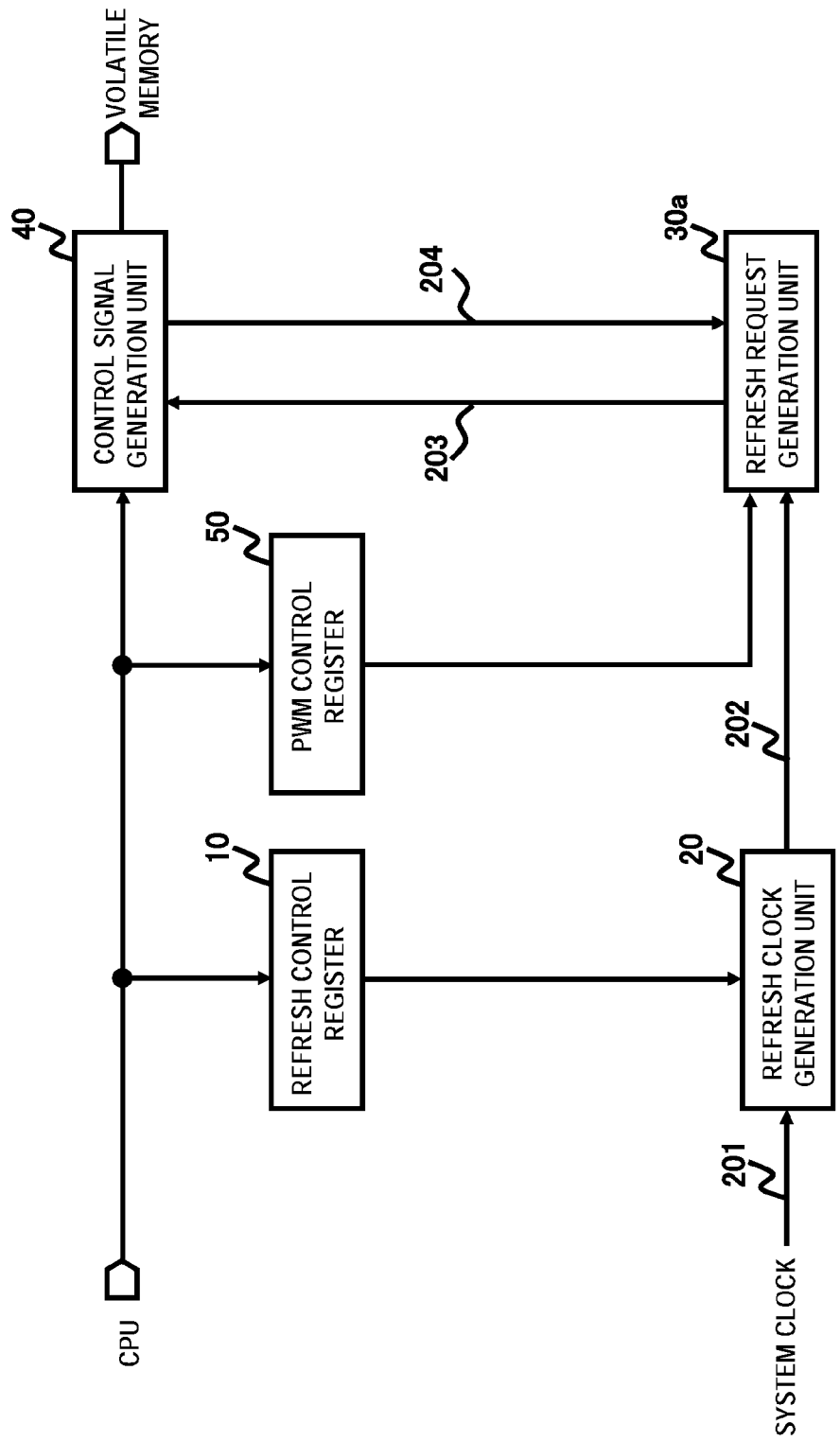
FIG. 5 is a diagram showing an example of an internal configuration of a memory controller 2 according to a first exemplary embodiment.

FIG. 5 is a diagram showing an example of an internal configuration of a memory controller 2 related to the present exemplary embodiment. Component elements in FIG. 5 that are the same as in FIG. 2 are represented by the same reference symbols and a description thereof is omitted.

Points of difference between the memory controller 1 shown in FIG. 2 and the memory controller 2 related to the present exemplary embodiment are the provision of a PWM (Pulse Width Modulation) control register 50, and an internal configuration of a refresh request generation unit 30a.

The PWM control register 50 is a register that holds PWM configuration information received via a bus from a CPU.

Figure 6:
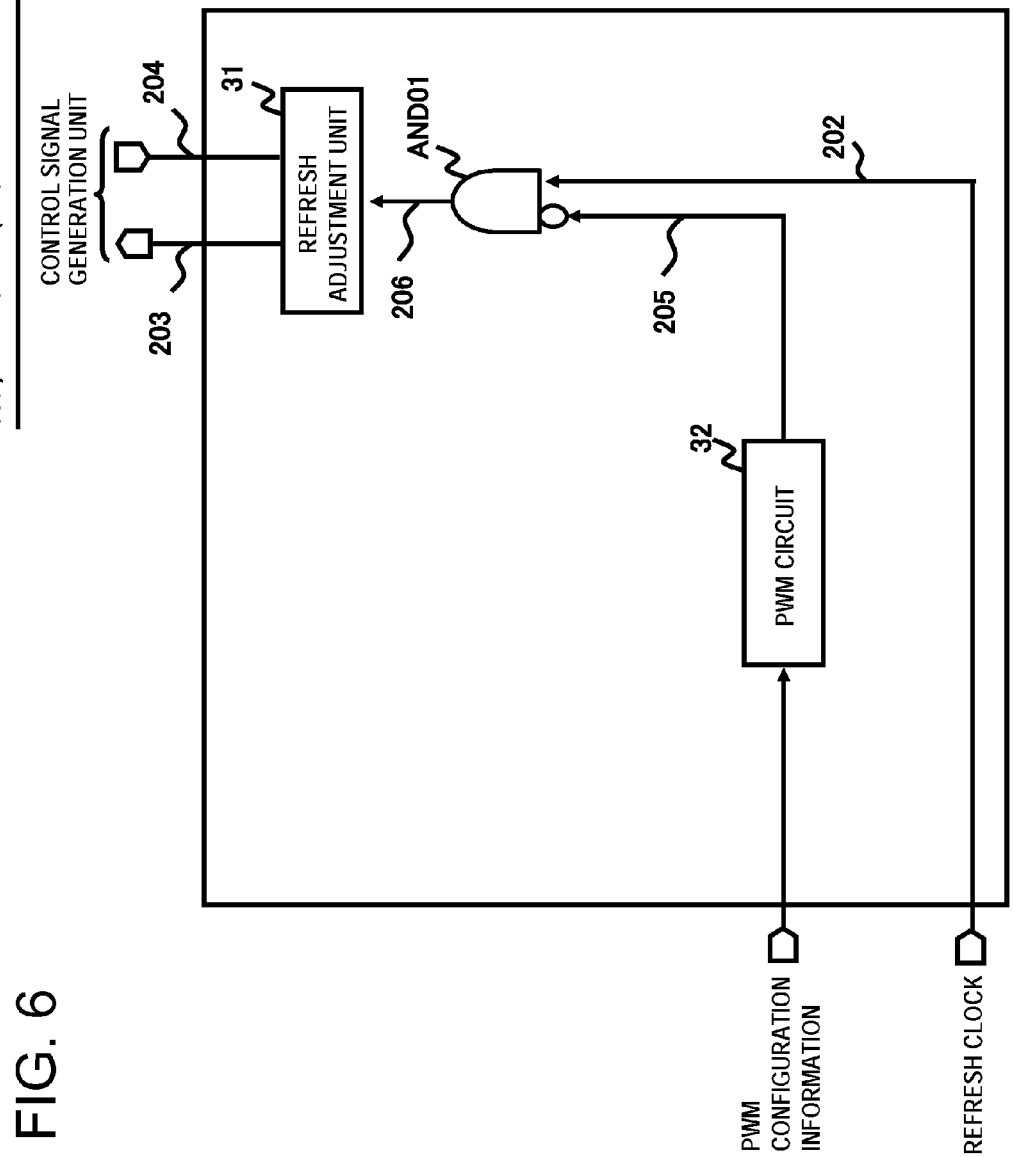

FIG. 6 is a diagram showing an example of the internal configuration of the refresh request generation unit 30a.

The refresh request generation unit 30a is configured to include a refresh adjustment unit 31, a PWM circuit 32, and an AND circuit AND01. Since the refresh adjustment unit 31 is as already described, a further description is omitted.

The PWM circuit 32 can output a PWM waveform having a cycle and duty ratio as prescribed by the PWM configuration information. The PWM circuit 32 may have any configuration as long as the PWM waveform output is possible, and a description thereof is omitted. It is to be noted that the PWM waveform outputted by the PWM circuit 32 is a refresh disable signal 205.

The AND circuit AND01 receives a signal obtained by inverting the refresh disable signal 205 outputted by the PWM circuit 32, and a refresh clock 202. An output signal of the AND circuit AND01 is outputted to the refresh adjustment unit 31. The output signal of the AND circuit AND01 is represented as a refresh clock 206 and is distinguished from the refresh clock 202 in the following description.

In a case where the refresh disable signal 205 has an L level, the AND circuit AND01 outputs the refresh clock 202 as it is to the refresh adjustment unit 31, as the refresh clock 206. On the other hand, in a case where the refresh disable signal 205 has a H level, the AND circuit AND01 sets the refresh clock 206 to an L level. In this way, the AND circuit AND01 masks the refresh clock 202 in accordance with the refresh disable signal 205. Therefore, when active, the refresh disable signal 205 has a H level.

Next, a description is given concerning operations of the memory controller 2.

Figure 7:
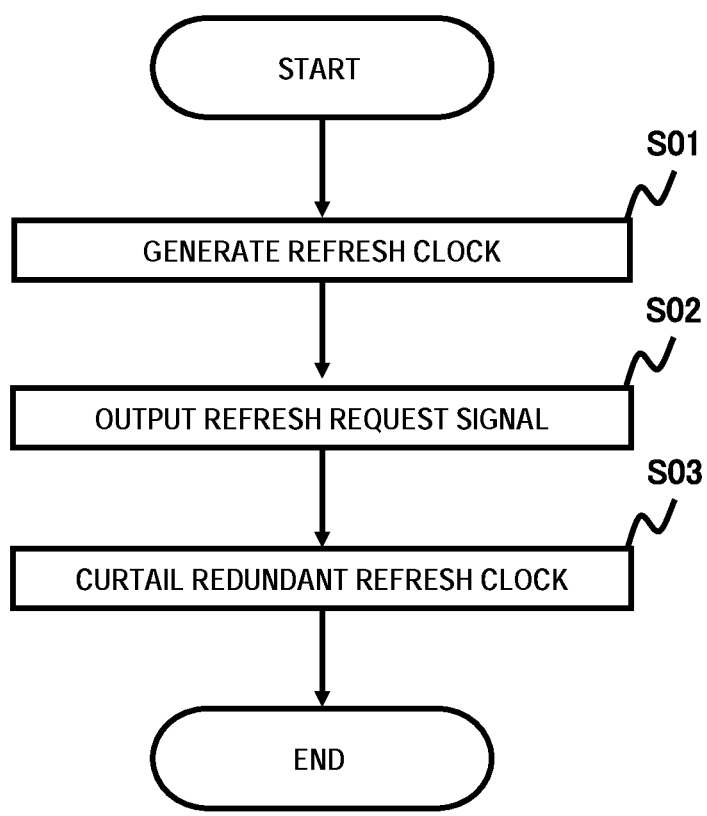
FIG. 7 is a flowchart showing an example of operations of the memory controller 2.

FIG. 7 is a flowchart showing an example of operations of the memory controller 2. The memory controller 2 operates as in the following outline.

A refresh clock generation unit 20 generates a refresh clock by frequency dividing a system clock (step S01). The refresh request generation unit 30a outputs a refresh request signal 203 to a control signal generation unit 40 based on the refresh clock 202 generated by the refresh clock generation unit 20 (step S02).

In addition, the refresh request generation unit 30a curtails output of a redundant refresh request signal 203 based on the PWM configuration information held by the PWM control register 50 (step S03). For example, with the refresh clock 202 having a cycle of 15.25 μs, a specified refresh period being 64 ms and a specified refresh count being 4096, redundant refresh control is executed 100 times as described above. However, by masking the refresh clock 202 outputted to the refresh adjustment unit 31, the refresh request generation unit 30a curtails execution of this redundant refresh control. In this regard, the refresh disable signal 205 outputted by the PWM circuit 32 is used in curtailing the refresh clock 202. That is, the cycle and duty ratio prescribed by the PWM configuration information are decided so as to curtail the redundant refresh clock 200 supply to the refresh adjustment unit 31.

Figure 8:
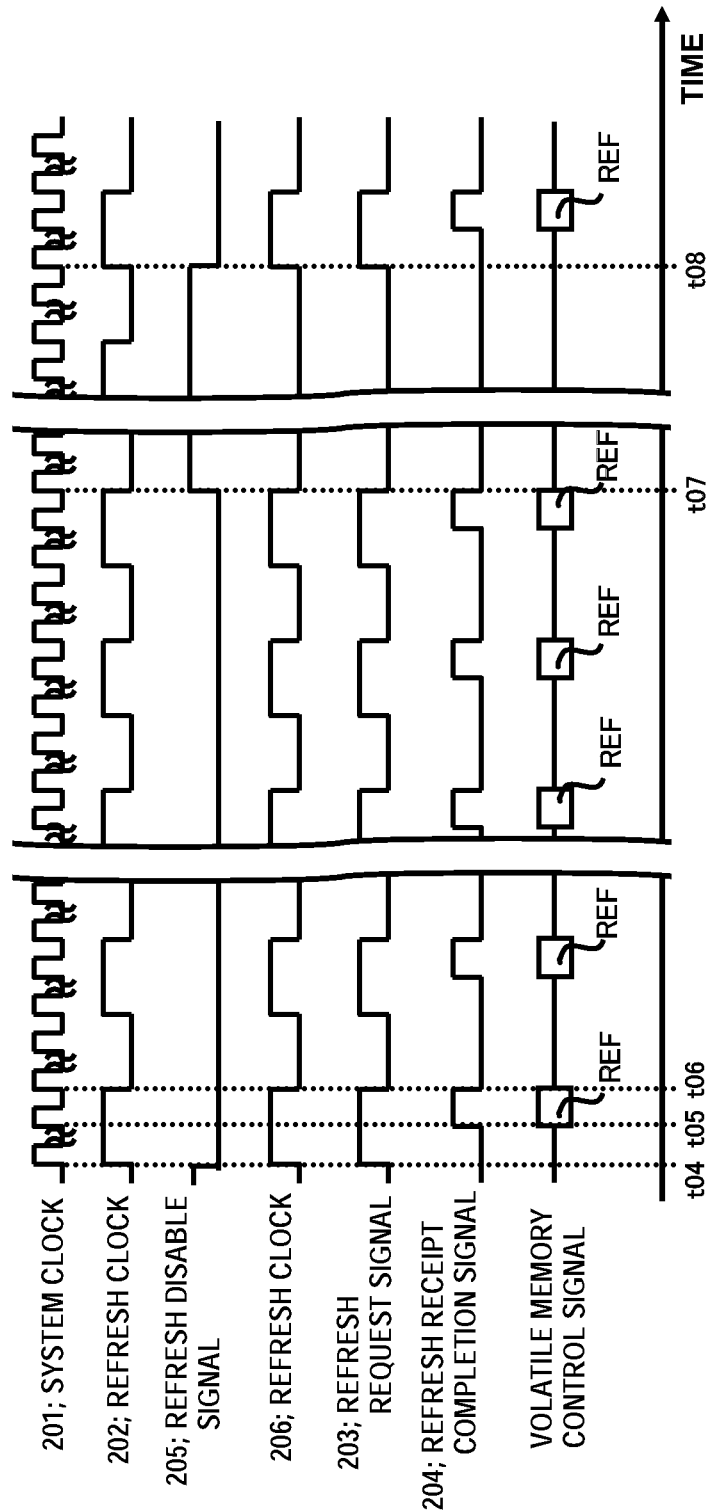
FIG. 8 is a diagram showing an example of a timing chart of a signal related to refresh control of the memory controller 2.

FIG. 8 is a diagram showing an example of a timing chart of a signal related to refresh control of the memory controller 2.

At time t04, the refresh clock 202 rises. The refresh disable signal 205 (PWM waveform) transitions to an L level. In the refresh request generation unit 30a, since the refresh disable signal 205 is at an L level, the refresh clock 202 is outputted as it is to the refresh adjustment unit 31, as the refresh clock 206.

The refresh adjustment unit 31 outputs the activated refresh request signal 203 to the control signal generation unit 40 in synchronization with rising of the refresh clock 206.

At time t05, the control signal generation unit 40 issues a refresh command to the volatile memory, in addition to outputting an activated refresh receipt completion signal 204 to the refresh adjustment unit 31. The refresh adjustment unit 31 that receives the activated refresh receipt completion signal 204 deactivates the refresh request signal 203 at time t06 and cancels a refresh request to the volatile memory. The memory controller 2 repeats this control until time t07.

At time t07, the PWM circuit 32 activates (sets to a H level) the refresh disable signal 205. Since the refresh disable signal 205 at a H level is received by the AND circuit AND01, the refresh clock 202 is masked, and a rising waveform of the refresh clock 206 is not outputted to the refresh adjustment unit 31. Accordingly, the refresh adjustment unit 31 does not activate the refresh request signal 203.

Activation of the refresh disable signal 205 by the PWM circuit 32 continues until time t08. Thereafter, at time t08 the PWM circuit 32 deactivates the refresh disable signal 205, and the memory controller 2 continues operations from time t04 onwards.

Here, in the period t04 to t07, the PWM configuration information held by the PWM control register 50 is decided such that refresh request signals 203 the same in number as the specified refresh count are activated. In the period t07 to t08, the PWM configuration information is decided such that the redundant refresh clock 202 is masked. In this way, the memory controller 2 controls refreshing of the volatile memory based on the PWM waveform (refresh disable signal 205) outputted by the PWM circuit 32. That is, the PWM configuration information is obtained based on the refresh standard and cycle of the system clock 201.

A description has been given above where, with regard to the PWM circuit 32, first a refresh request is made, and thereafter refresh control to curtail redundant refresh operations is performed. However, it is possible to curtails the redundant refreshes a prescribed number of times, after requesting a refresh request to the control signal generation unit 40 a prescribed number of times. For example, control is possible in which, after making a refresh request 100 times, 1 refresh operation is curtailed.

The memory controller 2 according to the present exemplary embodiment makes a refresh request 4096 times corresponding to the specified refresh count, at the head of a series of control cycles (time t04 to t07 in FIG. 8). Thereafter, after making refresh requests corresponding to the specified refresh count, issuing of redundant refresh requests is curtailed (time t07 to t08 in FIG. 8). As a result, while using the refresh clock 202 of 15.25 μs obtained by frequency dividing the system clock 201, it is possible to implement a refresh operation close to 4096 times, which is the specified refresh count during the specified refresh period (64 ms). That is, by curtailing the issuing of redundant refresh requests, it is possible to improve the usage efficiency of a bus connected to the volatile memory. Moreover, since redundant refresh operations are not executed, it is possible to curtail power consumption of the overall system.

The specification of the system including the memory controller 2 may be changed, and the system clock cycle may be changed. Even in such a case, by appropriately changing the PWM configuration information written from the CPU to the PWM control register 50, it is possible to flexibly handle specification changes with regard to the system clock.

Second Exemplary Embodiment

Next, a detailed description is given concerning a second exemplary embodiment, making reference to the drawings.

Figure 9:
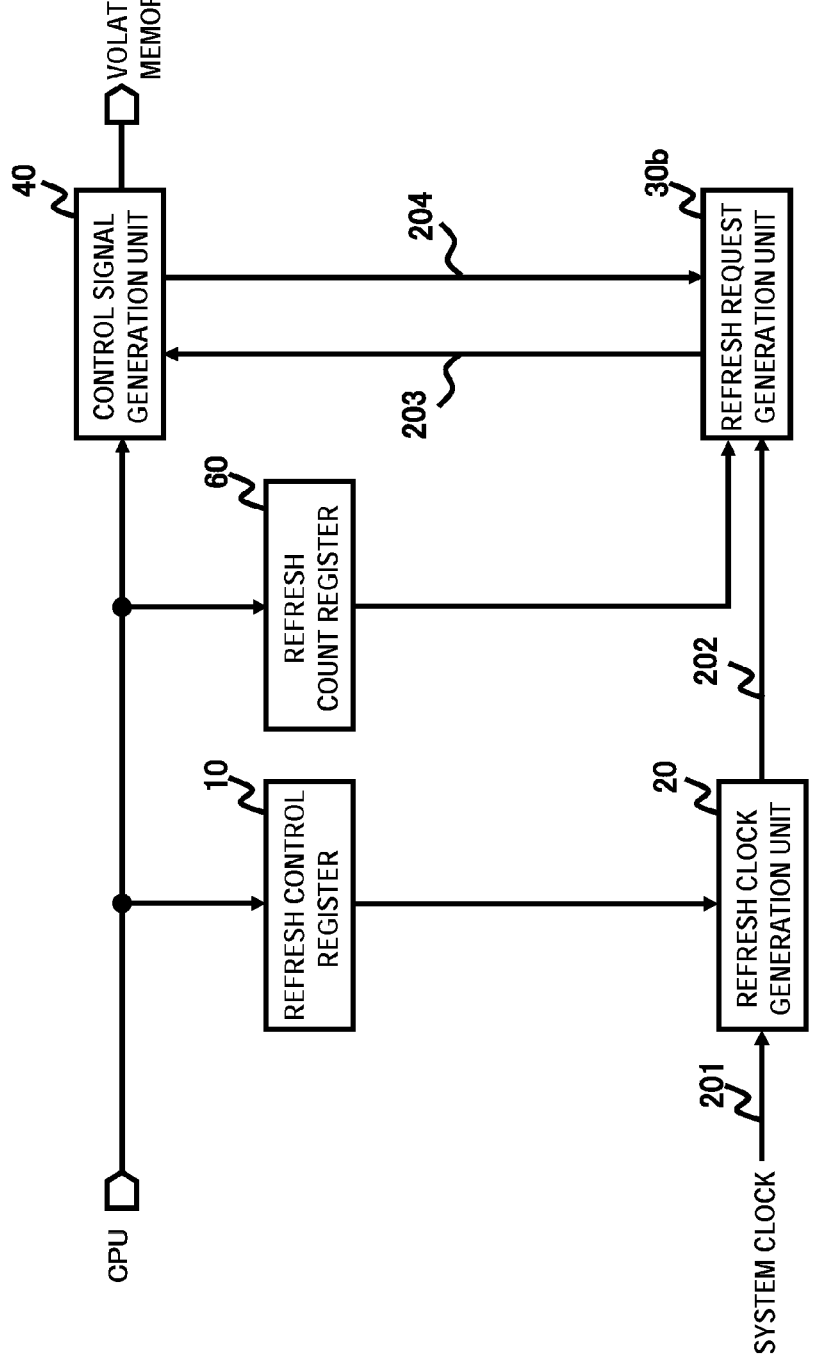
FIG. 9 is a diagram showing an example of an internal configuration of a memory controller 3 according to a second exemplary embodiment.

FIG. 9 is a diagram showing an example of an internal configuration of a memory controller 3 related to the present exemplary embodiment. Component elements in FIG. 9 that are the same as in FIG. 5 are given the same reference symbols and a description thereof is omitted.

Points of difference between the memory controller 2 and the memory controller 3 are a refresh count register 60 being provided instead of the PWM control register 50, and an internal configuration of a refresh request generation unit 30b.

The refresh count register 60 is a register that holds refresh count register information received from a CPU via a bus. The refresh count register information is information related to timing of masking a refresh clock 202.

Figure 10:
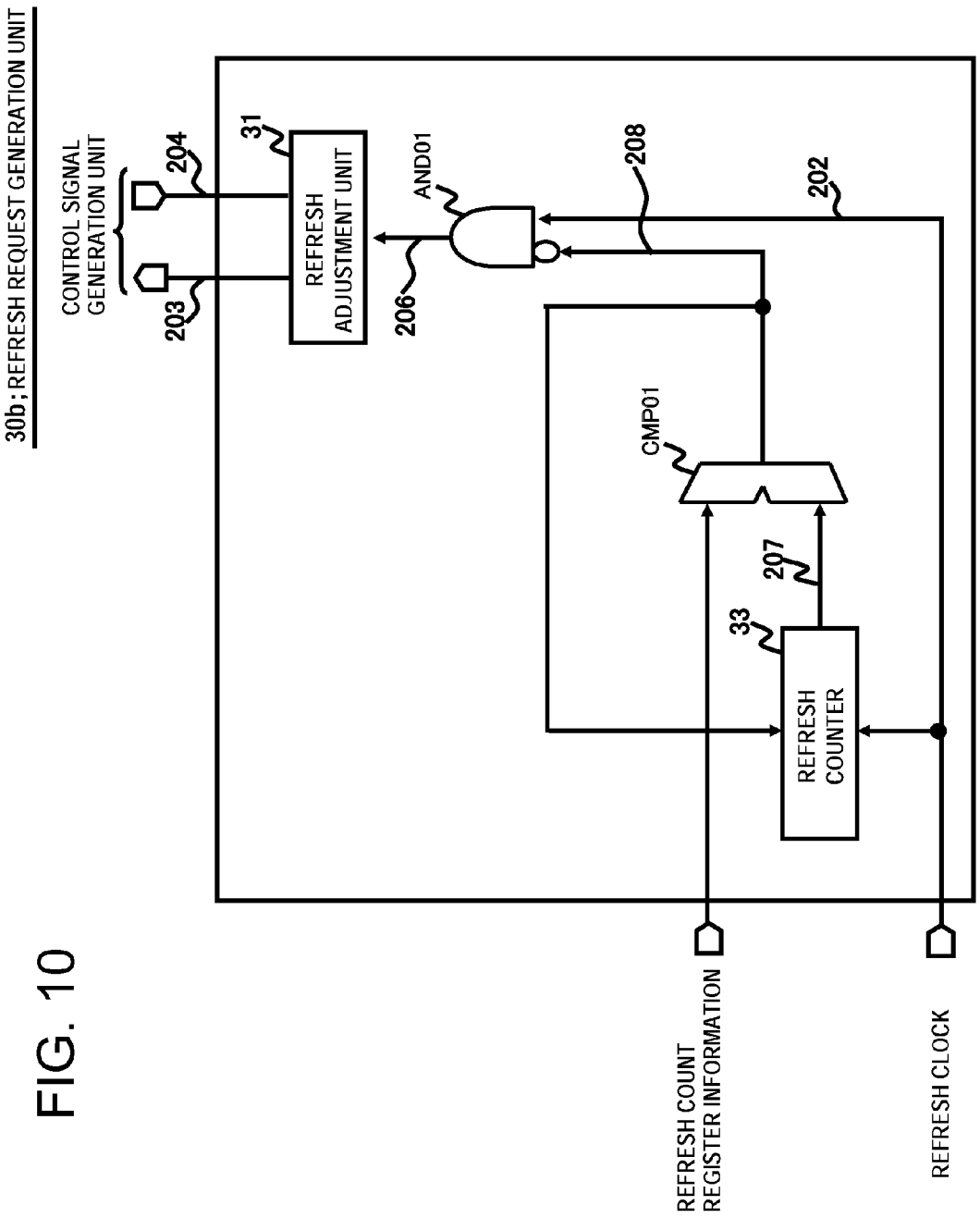
FIG. 10 is a diagram showing an example of an internal configuration of a refresh request generation unit 30b.

FIG. 10 is a diagram showing an example of the internal configuration of the refresh request generation unit 30b. Component elements in FIG. 10 that are the same as in FIG. 6 are represented by the same reference symbols and a description thereof is omitted.

A point of difference between the refresh request generation unit 30a and the refresh request generation unit 30b is that, instead of the PWM circuit 32, a comparator CMP01 and a refresh counter 33 are provided.

The refresh counter 33 counts the refresh clock 202, and outputs the count value as a refresh count value 207. The refresh counter 33 outputs the refresh count value 207 to the comparator CMP01. When an output signal of the comparator CMP01 transitions to a H level, the refresh counter 33 initializes (resets) the refresh count value 207.

The comparator CMP01 obtains the refresh count register information from the refresh count register 60. The comparator CMP01 compares the refresh count register information and the refresh count value 207 outputted by the refresh counter 33, and outputs a comparison result as a refresh disable signal 208. In a case where the refresh count register information and the refresh count value 207 do not match, the comparator CMP01 puts the refresh disable signal 208 to an L level.

On the other hand, in a case where the refresh count register information and the refresh count value 207 match, the refresh disable signal 208 is put to a H level. It is to be noted that the refresh disable signal 208 works similarly to the refresh disable signal 205. A signal obtained by inverting the refresh disable signal 208 is received by an AND circuit AND01.

Next, a description is given concerning operation of the memory controller 3.

Figure 11:
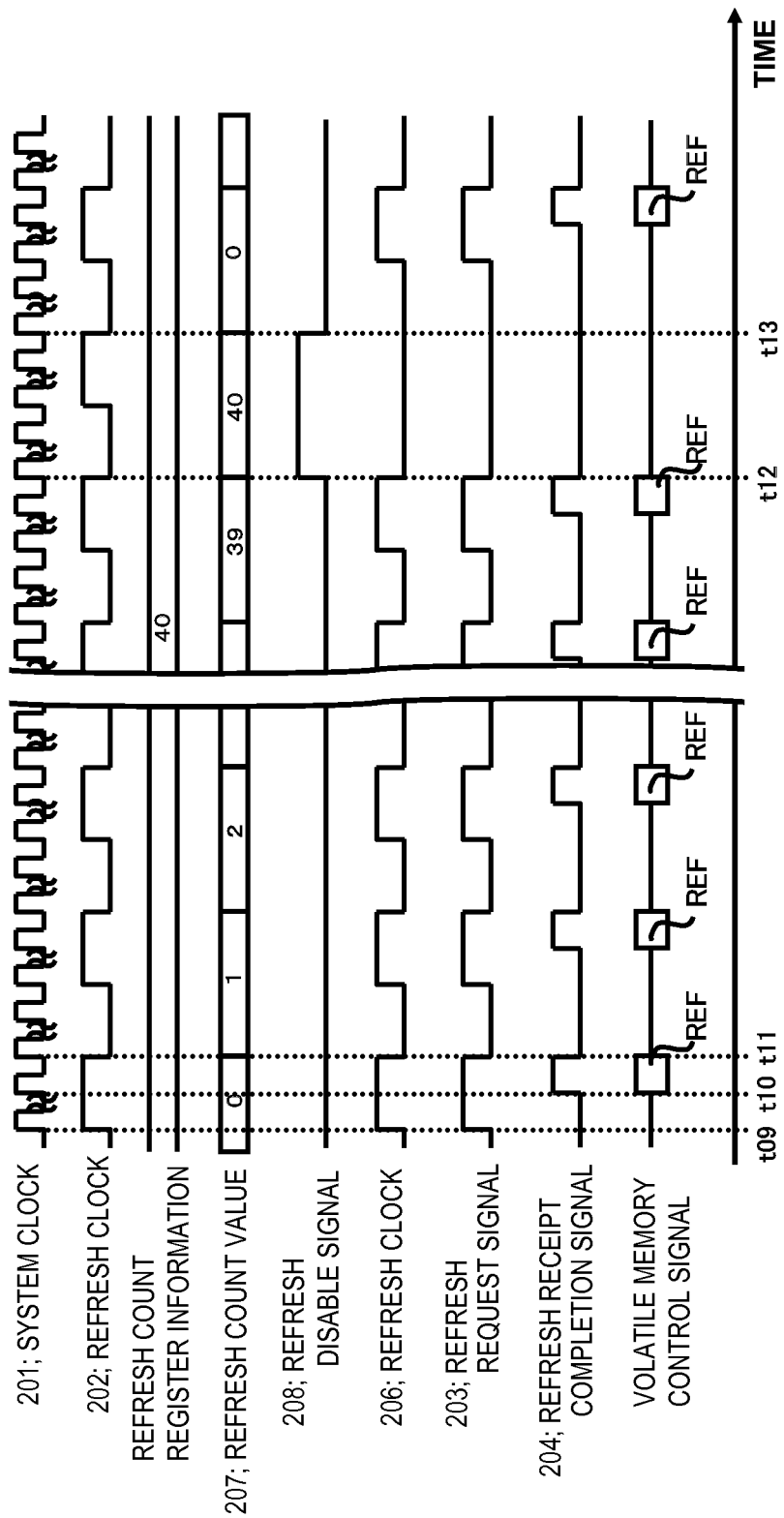
FIG. 11 is a diagram showing an example of a timing chart of a signal related to refresh control of the memory controller 3.

FIG. 11 is a diagram showing an example of a timing chart of a signal related to refresh control of the memory controller 3.

At time t09, the refresh clock 202 rises and a refresh request signal 203 is activated (transitions to a H level). Here, the refresh count register 60 is configured to "40" as refresh count register information. It is to be noted that the refresh count register information of "40" is a value determined based on a refresh standard and the cycle of a system clock 201. A description of a determination method thereof is given later.

Since the value of the refresh count register information is "40", the refresh count register information and the refresh count value 207 do not match. Accordingly, the comparator CMP01 outputs a refresh disable signal 208 at an L level. Since the refresh disable signal 208 is at an L level, the refresh clock 202 is outputted as it is to a refresh adjustment unit 31.

The refresh adjustment unit 31 receives a rising waveform of a refresh clock 206 and activates the refresh request signal 203 (time t10). The control signal generation unit 40 that receives the activated refresh request signal 203 activates a refresh receipt completion signal 204 and issues a refresh command to volatile memory (time t10).

The refresh adjustment unit 31 that receives the activated refresh receipt completion signal 204 deactivates the refresh request signal 203 (time t11). The memory controller 3 repeats this control until time t12.

Time t12 is a point in time at which the refresh count register information and the refresh count value 207 match. At time t12, the comparator CMP01 outputs the activated refresh disable signal 208.

Since the refresh disable signal 208 at a H level is received by the AND circuit AND01 included in the refresh request generation unit 30b, even with receipt of a rising edge of the refresh clock 202, the refresh clock 206 is at an L level. That is, the refresh clock 202 is masked, and a rising waveform of the refresh clock 206 is not received by the refresh adjustment unit 31. Accordingly, the refresh adjustment unit 31 does not activate the refresh request signal 203.

By receiving the refresh disable signal 208 at a H level, the refresh counter 33 initializes the refresh count value 207 at the next refresh clock 202 fall, and re-starts a count (time t13). The memory controller 3 operates as described above.

A value calculated in advance is used in the refresh count register information. For example, the cycle of the refresh clock 202 is 15.25 μs, a specified refresh period is 64 ms, and a specified refresh count is 4096. In this case, 100 redundant refresh requests are made as described above.

Accordingly, in the memory controller 3, a value of 40, obtained by dividing 4096, which is the specified refresh count, by 100, which is the redundant refresh count, is the refresh count register information. Thereupon, since the refresh clock 202 is not masked until the refresh counter 33 counts a refresh clock 202 40 times, 40 refresh requests are made. After 40 refresh requests are made, one refresh request is curtailed (time t12 to t13 in FIG. 11).

By repeating this cycle of issuing refresh requests and curtailing refresh requests 100 times, it is possible to implement refresh control 4096 times, which is the specified refresh count in the specified refresh period. That is, it is possible to curtail the redundant refresh requests (100 times) occurring in the specified refresh period (64 ms). By curtailing the issuing of redundant refresh requests, it is possible to improve the usage efficiency of a bus connected to the volatile memory. Moreover, since redundant refresh operations are not executed, it is possible to curtail power consumption of the overall system. In addition, by curtailing the redundant refresh requests at uniform intervals, the memory controller 3 can equalize bus usage (no variation in bus usage efficiency).

The circuit size of the PWM circuit 32 used in the memory controller 2 related to the first exemplary embodiment is relatively large. On the other hand, the refresh counter 33 and the comparator CMP01 used in the memory controller 3 related to the present exemplary embodiment can be implemented by a small sized circuit. Therefore, a memory controller that improves bus usage efficiency while curtailing increase in chip area is provided.

Third Exemplary Embodiment

Next, a detailed description is given concerning a third exemplary embodiment, making reference to the drawings.

Figure 12:
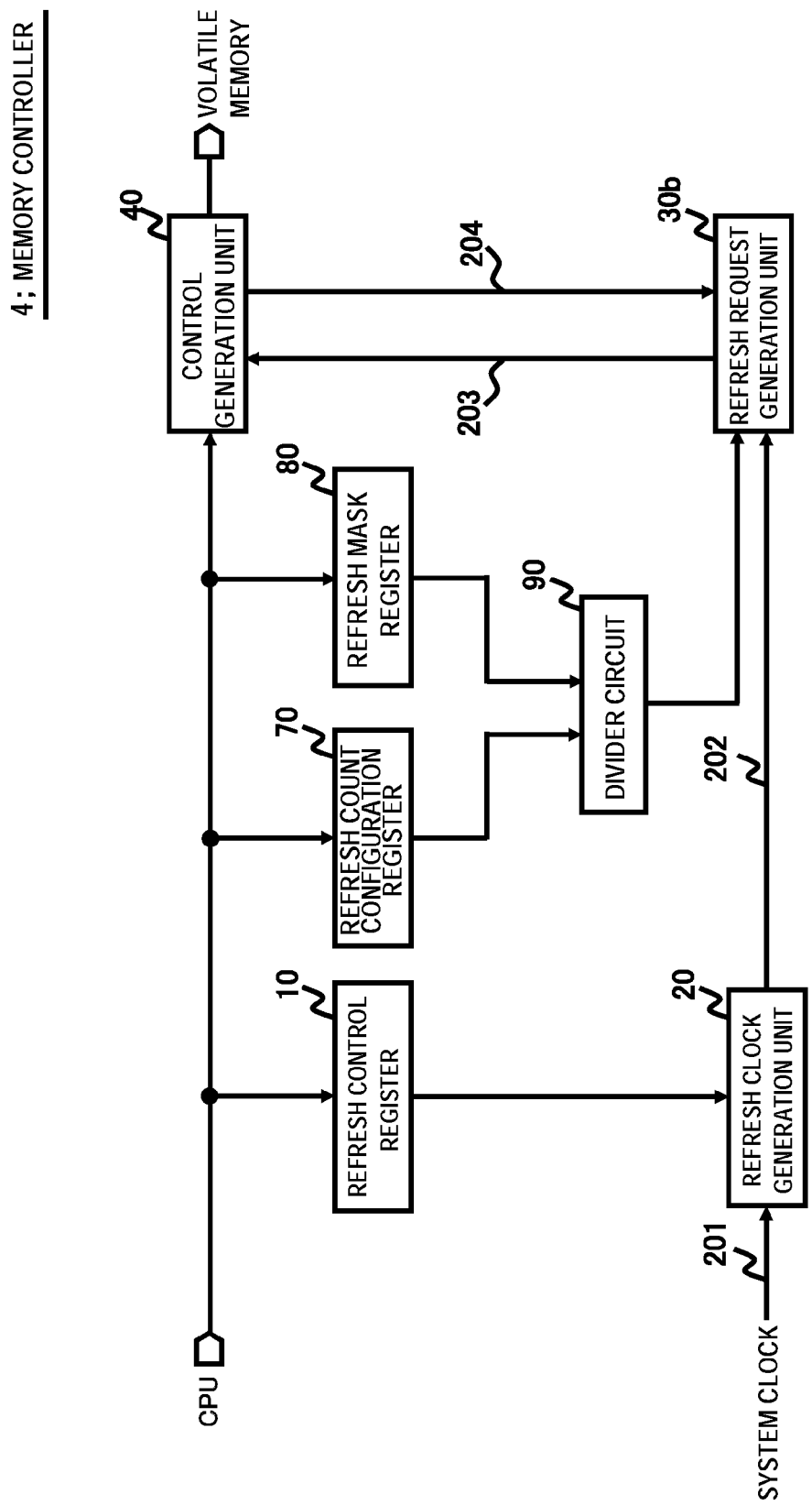
FIG. 12 is a diagram showing an example of an internal configuration of a memory controller 4 according to a third exemplary embodiment.

FIG. 12 is a diagram showing an example of an internal configuration of a memory controller 4 related to the present exemplary embodiment. Component elements in FIG. 12 that are the same as in FIG. 9 are given the same reference symbols and a description thereof is omitted.

A point of difference between the memory controller 3 and the memory controller 4 is that a refresh count configuration register 70, a refresh mask register 80, and a divider circuit 90 are provided, instead of the refresh count register 60.

The refresh count configuration register 70 is a register that holds refresh count configuration information received via a bus from a CPU. The refresh count configuration information is information that corresponds with a specified refresh count.

The refresh mask register 80 is a register that holds refresh mask information received from the CPU via the bus. The refresh mask information is information that corresponds to a redundant refresh count calculated from a system clock and the specified refresh count.

The divider circuit 90 outputs a result of dividing the refresh count configuration information held by the refresh count configuration register 70, by the refresh mask information held by the refresh mask register 80, to a refresh request generation unit 30b.

Specifically, the cycle of a refresh clock 202 is 15.25 µs, a specified refresh period is 64 ms, and the specified refresh count is 4096. In this case, redundant refresh requests are made 100 times. Therefore, the refresh count configuration information is set to 4096, the refresh mask information is set to 100, and the result of dividing these by the divider circuit 90 is outputted. Discarding digits after the decimal point in the division result, a calculation result "40" is outputted to a comparator CMP01.

The comparator CMP01 compares the result outputted by the divider circuit 90 and a refresh count value 207, and decides to issue or to curtail a refresh request. It is to be noted that since there is no difference between operation of the memory controller 4 and the memory controller 3, a further description is omitted.

In this way, information corresponding to the refresh count register information inside the memory controller 4 may be generated, rather than calculating the refresh count register information in advance. Improvement of bus usage efficiency, curtailment of power consumption and equalization of bus usage efficiency can be realized in the memory controller 4.

Fourth Exemplary Embodiment

Next, a detailed description is given concerning a fourth exemplary embodiment, making reference to the drawings.

In the present exemplary embodiment, a description is given concerning a system to control volatile memory used in an image display system using a liquid crystal panel or the like.

Figure 13:
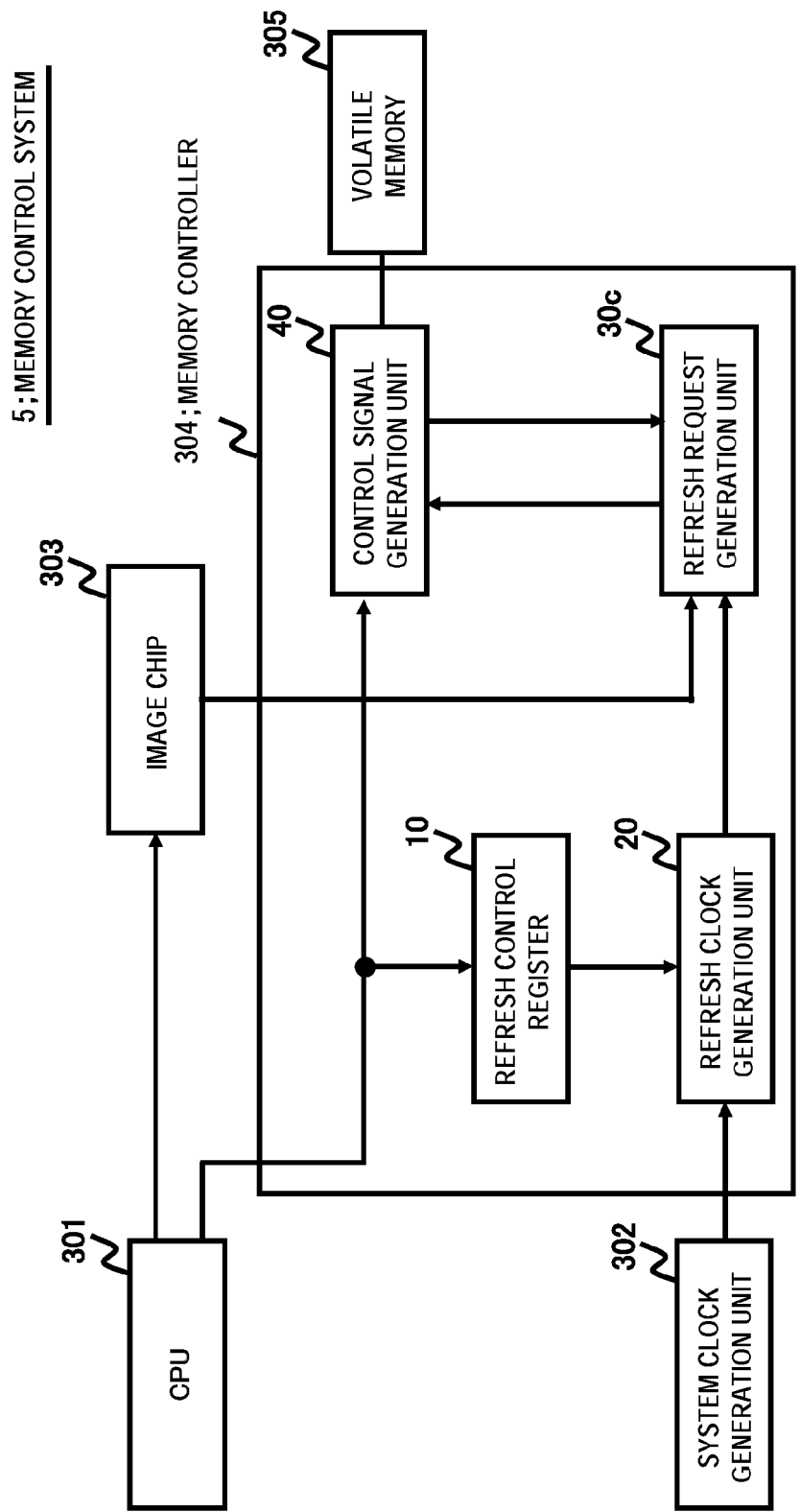
FIG. 13 is a diagram showing an example of a configuration of a memory control system 5 according to a fourth exemplary embodiment.

FIG. 13 is a diagram showing an example of a configuration of a memory control system 5. Component elements in FIG. 13 that are the same as in FIG. 5 are represented by the same reference symbols and a description thereof is omitted.

The memory control system 5 is configured to include a CPU 301, a system clock generation unit 302, an image chip 303, a memory controller 304, and a volatile memory 305.

The CPU 301 controls respective parts such as the memory controller 304 and the image chip 303. The refresh clock generation unit 302 generates a system clock.

The image chip 303 is used as a controller of a driver (not shown in the drawings) that drives the liquid crystal panel (not shown in FIG. 13), and outputs various types of control signal to the driver. The volatile memory 305 stores an image signal supplied to the driver.

The image chip 303 outputs a vertical synchronization signal VSYNC. The vertical synchronization signal VSYNC is fundamentally a control signal supplied to a driver that drives the liquid crystal panel or the like, but in the memory control system 5, it is supplied to the memory controller 304. The vertical synchronization signal VSYNC can be used as a switching signal for an image line display, and it is possible to distinguish a "blank period" in which an image signal is not transmitted. It is to be noted that a period in which the vertical synchronization signal VSYNC is at an L level corresponds to the blank period.

By implementing refresh control during this blank period, by the memory controller 304, an improvement in system performance is realized. If refresh control of the volatile memory 305 is carried out in the middle of transmission of an image signal to the driver of the liquid crystal panel from the volatile memory 305, there is a possibility that transmission of the image signal will not being stable and noise will be generated on a display screen. Accordingly, the memory controller 304 uses the vertical synchronization signal VSYNC to execute refreshing of the volatile memory 305 in a period in which the image signal is not transmitted.

Figure 14:
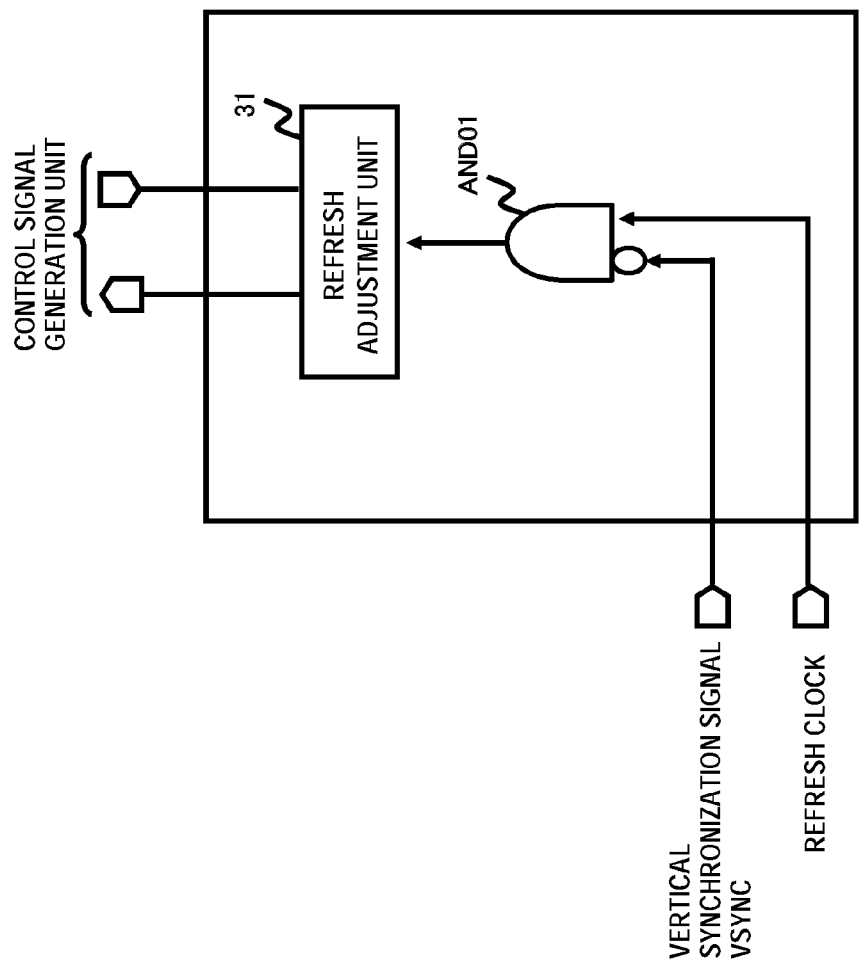
FIG. 14 is a diagram showing an example of an internal configuration of a refresh request generation unit 30c.

FIG. 14 is a diagram showing an example of an internal configuration of a refresh request generation unit 30c.

The refresh request generation unit 30c receives, at an AND circuit AND01 comprised therein, a signal obtained by inverting the vertical synchronization signal VSYNC, and a refresh clock. In a period (blank period) in which the vertical synchronization signal VSYNC is at an L level, a rising waveform of the refresh clock is outputted from the AND circuit AND01 to a refresh adjustment unit 31, and refreshing of the volatile memory 305 is performed. On the other hand, in a period in which the vertical synchronization signal VSYNC is at a H level, a refresh clock supply to the refresh adjustment unit 31 is curtailed. Therefore, in a period in which the vertical synchronization signal VSYNC is at a H level, refreshing of the refresh adjustment unit 305 is not performed.

FIG. 15 is a diagram showing an example of a timing chart of various types of signal in the memory control system 5. In a period of t14 to t15, the vertical synchronization signal VSYNC at an L level is supplied to the memory controller 304. Since the period t14 to t15 is the blank period described above, there is no transmission of an image signal to the driver of the liquid crystal panel or the like from the volatile memory 305. By implementing refreshing of the volatile memory 305 in this blank period, it is possible to curtail noise occurring in the liquid crystal panel. In this way, the memory control system 5 shown in FIG. 13 preferably implements refresh control of the volatile memory 305 holding an image signal to be supplied to the liquid crystal panel.

The disclosure of the above stated Patent Publications is incorporated by reference herein. The particular exemplary embodiments or examples may be modified or adjusted within the gamut of the entire disclosure, inclusive of claims, based on the fundamental technical concept of the disclosure. Moreover, a variety of combinations or selections of elements disclosed herein, inclusive of elements of the claims, exemplary embodiment or Examples as well as elements of the drawings may be made within the concept of the claims. Viz., the present disclosure may encompass a wide variety of modifications or corrections that may occur to those skilled in the art in accordance with the entire disclosure, inclusive of claim and the technical concept of the present disclosure. For example, clearly it is possible to form a circuit in which an activated level of the various types of signal including the refresh request signal 203 is modified as appropriate. In particular, as regards the ranges of numerical values, set out above, optional numerical values or optional sub-ranges, contained in such ranges, should be interpreted as if they are explicitly stated, even though such optional numerical values or optional sub-ranges are not so stated.

What is claimed is:

1. A memory controller comprising:
a refresh clock generation unit that generates a clock obtained by frequency dividing a system clock, as a refresh clock;
a control signal generation unit that issues a refresh command to a memory, based on said refresh clock; and
a refresh request generation unit that curtails, based on a specified refresh count in a specified refresh period determined by said memory, a supply to said control signal generation unit of a redundant refresh clock generated exceeding said specified refresh count, said refresh clock being generated within said specified refresh period.

2. The memory controller according to claim 1, further comprising a PWM (Pulse Width Modulation) control register that holds PWM configuration information related to cycle and duty ratio of a PWM waveform; wherein
said refresh request generation unit comprises:
a PWM circuit that outputs a PWM waveform based on said PWM configuration information,
an AND circuit that receives said refresh clock and said PWM waveform, and
a refresh adjustment unit that activates a refresh request signal outputted to said control signal generation unit, based on an output signal of said AND circuit; and wherein
said control signal generation unit, on issuing said refresh command in accordance with said refresh request signal that is activated, activates a refresh receipt completion signal outputted to said refresh adjustment unit; and
said refresh adjustment unit deactivates said refresh request signal in accordance with said activated refresh receipt completion signal.

3. The memory controller according to claim 2, wherein said AND circuit receives a signal obtained by inverting said PWM waveform, and
said refresh adjustment unit activates said refresh request signal in synchronization with rising of said refresh clock outputted by said AND circuit.

4. The memory controller according to claim 3, wherein said PWM configuration information is information determined based on a cycle of said system clock, said specified refresh period, and said specified refresh count.

5. The memory controller according to claim 1, wherein said refresh request generation unit curtails a supply to said control signal generation unit of said refresh clock generated within said specified refresh period, at a uniform interval, based on the number of said redundant refresh clocks.

6. The memory controller according to claim 5, further comprising a refresh count register that holds refresh count register information determined based on a cycle of said system clock, said specified refresh period, and said specified refresh count; wherein
said refresh request generation unit comprises:
a refresh counter that counts said refresh clock and outputs a count value as a refresh count value,
a comparator that compares said refresh count register information and said refresh count value;
an AND circuit that receives said refresh clock and an output signal of said comparator, and
a refresh adjustment unit that activates a refresh request signal outputted to said control signal generation unit, based on an output signal of said AND circuit; and wherein
said control signal generation unit, on issuing said refresh command in accordance with said refresh request signal that is activated, activates a refresh receipt completion signal outputted to said refresh adjustment unit; and
said refresh adjustment unit deactivates said refresh request signal in accordance with said activated refresh receipt completion signal.

7. The memory controller according to claim 6, wherein said refresh count register comprises:
a refresh count configuration register that holds said specified refresh count as refresh count configuration information, and
a refresh mask register that holds the number of times said redundant refresh clock is issued as refresh mask information; and wherein
said memory controller further comprises a divider circuit that outputs a result of dividing said refresh count configuration information by said refresh mask information, as said refresh count register information.

8. A memory control method comprising:
generating a refresh clock by frequency dividing a system clock;
issuing a refresh command to a memory based on said refresh clock; and
curtailing, based on a specified refresh count in a specified refresh period determined by said memory, a supply of a redundant refresh clock generated exceeding said specified refresh count, said refresh clock being generated within said specified refresh period.

9. The memory control method according to claim 8, wherein curtailing the redundant refresh clock comprises:
outputting a PWM (Pulse Width Modulation) waveform based on PWM configuration information determined based on a cycle of said system clock, said specified refresh period, and said specified refresh count; and
curtailing a supply of said redundant refresh clock, based on said PWM waveform.

10. The memory control method according to claim 8, wherein curtailing the redundant refresh clock comprises curtailing a supply of said refresh clock generated within said specified refresh period, at a uniform interval, based on the number of said redundant refresh clocks.

11. The memory control method according to claim 8, wherein curtailing the redundant refresh clock comprises:
supplying said refresh clocks equivalent in number to said specified refresh count; and
curtailing a supply of said refresh clocks equivalent in number to said redundant refresh clocks.

12. A memory control system comprising:
an image chip that outputs a vertical synchronization signal;
a memory that stores an image signal;
a system clock generation unit that generates a system clock; and
a memory controller comprising:
a refresh clock generation unit that generates a clock obtained by frequency dividing a system clock, as a refresh clock;
a control signal generation unit that issues a refresh command to said memory, based on said refresh clock; and
a refresh request generation unit that curtails a supply to said control signal generation unit of said generated refresh clock during a predetermined logic level where said vertical synchronization signal indicates a period in which said image signal is transmitted.

* * * * *